United States Patent [19]

Breithaupt

[11] 4,218,638
[45] Aug. 19, 1980

[54] PUSH-PULL AMPLIFIER

[75] Inventor: David W. Breithaupt, Maple Shade, N.J.

[73] Assignee: RCA Corporation, New York, N.Y.

[21] Appl. No.: 955,540

[22] Filed: Oct. 30, 1978

[30] Foreign Application Priority Data

Apr. 10, 1978 [GB] United Kingdom ............... 13899/78

[51] Int. Cl.$^2$ .......................... H01J 29/70; H03F 3/26
[52] U.S. Cl. ...................................... 315/397; 315/403; 330/263; 330/267; 330/268
[58] Field of Search .................. 315/396, 403, 393, 10, 315/397; 330/263, 267, 268

[56] References Cited

U.S. PATENT DOCUMENTS

| | | | |
|---|---|---|---|
| 3,426,245 | 2/1969 | Yurasek et al. | 315/397 X |
| 3,559,086 | 1/1971 | Wyckoff, Jr. | 330/268 |
| 3,740,657 | 6/1973 | Tharmaratnam | 330/15 |
| 3,781,589 | 12/1973 | Brockmann | 315/397 X |
| 3,786,303 | 1/1974 | Hilburn | 315/397 |
| 3,852,678 | 12/1974 | Frye | 330/268 X |
| 3,965,390 | 6/1976 | Spencer, Jr. | 315/397 |
| 3,969,653 | 7/1976 | Fukaya | 315/403 |
| 3,979,641 | 9/1976 | Arakawa et al. | 315/397 |
| 3,983,452 | 9/1976 | Bazin | 315/403 X |

FOREIGN PATENT DOCUMENTS 1364491 8/1974 United Kingdom .

Primary Examiner—Malcolm F. Hubler
Attorney, Agent, or Firm—Eugene M. Whitacre; Paul J. Rasmussen; William H. Meise

[57] ABSTRACT

A vertical deflection amplifier includes a driver amplifier stage having a source of sawtooth deflection signals at the vertical rate and direct current feedback from the vertical deflection winding as inputs. The driver amplifier stage drives a pair of voltage translation stages each of which drives a transistor in a complementary-symmetry output stage. The voltage translation stages are independent of each other and are biased to operate as constant current sources with no signal present for controlling the quiescent current of the output stage. The improved vertical amplifier can thus be utilized to pass a horizontal rate signal combined with the vertical rate signal to effect image rotation when the deflection amplifier is used with an image pickup tube.

6 Claims, 1 Drawing Figure

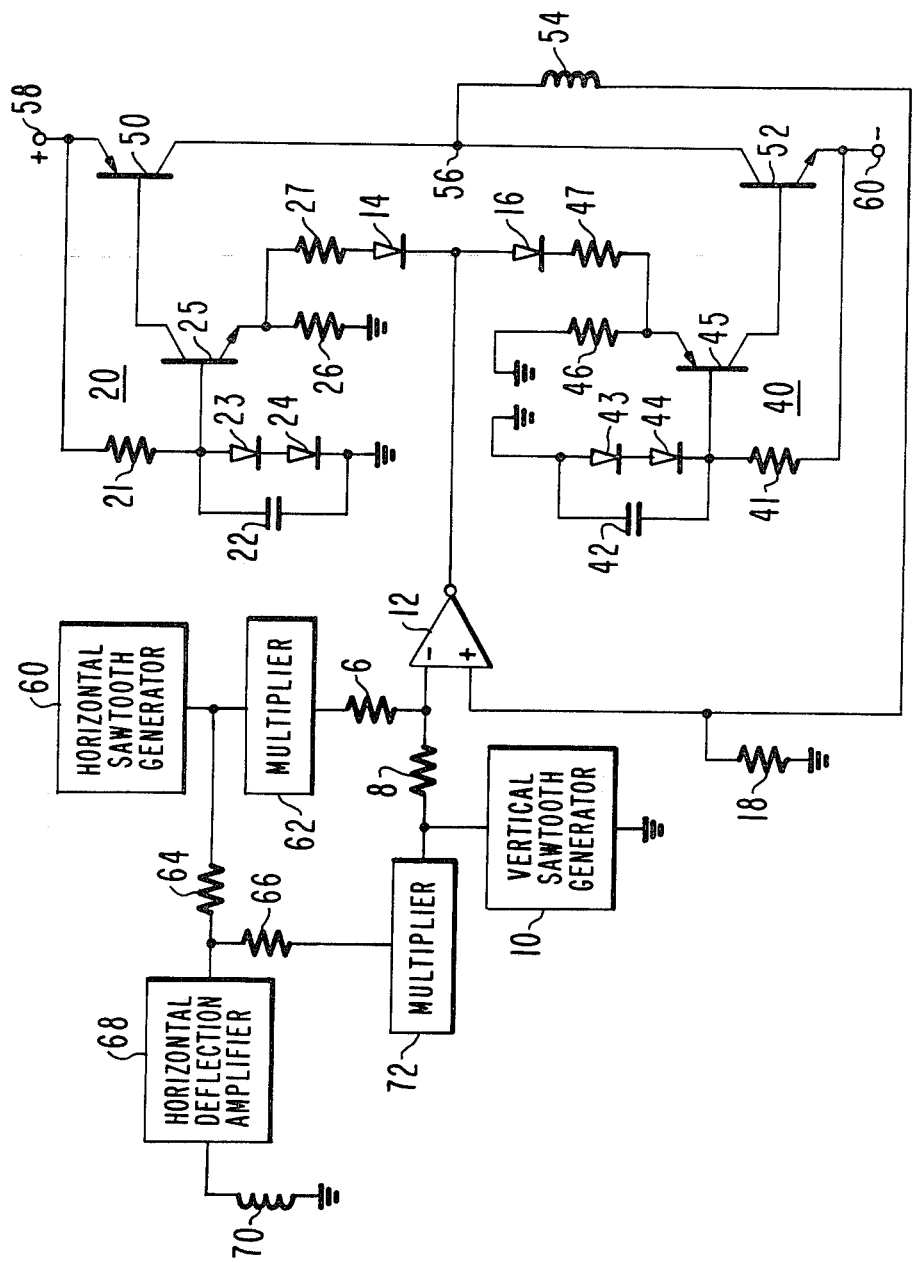

PUSH-PULL AMPLIFIER

BACKGROUND OF THE INVENTION

This invention relates to a vertical deflection amplifier.

It has been known to modulate the horizontal scanning waveform with a vertical scanning waveform to correct for keystone distortion generated, for example, in the operation of an iconoscope. The vertical rate signal introduces a tilt into the vertical lines of the scanned image at the vertical rate, thus correcting for skew in the vertical direction.

It would be desirable to modulate the vertical scanning waveform with the horizontal scanning waveform in order to introduce a tilt into the horizontal lines of the scanned image and thus correct for horizontal skew. If both horizontal and vertical skew corrections are applied simultaneously, the resulting image can be rotated in the image plane. The ability to rotate the image is useful, for example, in a color television camera where it is necessary to correct for the misregistration between the images produced by the three image pickup tubes.

The introduction of vertical frequency components into the horizontal deflection amplifier can be accomplished without difficulty because the relatively low frequency vertical components are readily accommodated by an amplifier designed to operate at the horizontal frequency. The vertical rate retrace voltage pulse generated by the application of the vertical scanning waveform to the horizontal deflection coil is relatively small and thus does not tax the dynamic range of the horizontal deflection amplifier.

However, the introduction of horizontal scanning components into the vertical deflection waveform poses serious problems for the vertical deflection amplifier. Vertical deflection amplifiers need only reproduce a 60 hertz sawtooth waveform and are therefore typically of limited bandwidth. The horizontal deflection frequency, being the 263rd harmonic of the vertical deflection frequency, will pose some frequency response difficulties for the vertical deflection amplifier. The most serious frequency response problem is created by the horizontal retrace pulse component which has a fundamental frequency of 80 kilohertz. In addition, in order to produce the required fast rising edges and squared-off corners of this retrace pulse, a bandwidth of approximately 0.5 megahertz is required in the amplifier.

The horizontal retrace pulse will also severely tax the dynamic range requirements of the vertical deflection amplifier. At the low frequencies utilized in vertical deflection, the vertical deflection coil will appear primarily resistive. At 80 kilohertz, this coil will appear highly inductive and thus exhibit a high impedance. It is necessary that a sawtooth current be driven through the vertical deflection coil at the horizontal rate in order to accomplish the horizontal skew correction or image rotation. This requires that the amplifier have the necessary dynamic range to generate the resulting retrace voltage pulse.

It is possible to solve this problem by utilizing a second horizontal deflection amplifier to drive the vertical deflection coil. Horizontal deflection amplifiers for television cameras are typically class A amplifiers. Class A amplifiers are of low efficiency which wastes energy, requires high capacity power supplies, and places a higher heat burden upon the equipment.

The use of a class B vertical drive amplifier would solve the efficiency problem posed by the class A amplifier. A suitable class B amplifier having emitter follower output stages would require a high voltage gain driver amplifier stage. Gain bandwidth limitations of the driver stage make such designs impractical.

SUMMARY OF THE INVENTION

A vertical deflection amplifier comprises a push-pull amplifier having a pair of amplifier stages connected in push-pull. A pair of common base amplifiers each have the collector coupled to and are each of a complementary type to the transistor at the input of respective ones of the amplifier stages. A source of signals to be amplified is coupled to each of the common base amplifiers for driving the amplifier stages to reproduce the signal. The common base amplifiers are biased, in the absence of signals, as constant current sources each independent of the other. The constant current sources control the quiescent current in the amplifier stages.

In an embodiment of the present invention the vertical deflection amplifier is part of a system for rotating the image generated by an image pickup tube of a television camera. This system includes a horizontal sawtooth coupled to a first adder circuit the output of which is coupled to the input of a horizontal deflection amplifier. The output of the horizontal deflection amplifier is coupled to a horizontal deflection coil. The horizontal sawtooth generator is coupled via a multiplier circuit to a second adder circuit. A source of vertical deflection signals is coupled by a second multiplier to the first adder circuit and is also coupled to the second adder circuit. The multiplier circuits determine the amount and polarity of horizontal deflection signal added to the vertical deflection signal and vice versa, for determining the amount of rotation of the image to be affected.

BRIEF DESCRIPTION OF THE DRAWING

The FIGURE is a diagram, partially in block form, of an amplifier circuit embodying the present invention.

DESCRIPTION OF A PREFERRED EMBODIMENT OF THE INVENTION

Referring to the FIGURE, a horizontal sawtooth generator 60 is coupled to a first multiplier circuit 62 for determining the amount and the polarity of the horizontal scanning waveform which is to be combined with the vertical scanning waveform. The multiplier circuit 62 is a 4-quadrant multiplier of any known type capable of producing an output of either polarity with a controllable amplitude.

The horizontal sawtooth generator 60 is coupled to a horizontal deflection amplifier 68 via resistor 64. A source of vertical scanning signals 10 is coupled to a second multiplier circuit 72 for determining the amount and the polarity of the vertical scanning waveform which is to be combined with the horizontal scanning waveform. The second multiplier circuit 72 may be similar to the first multiplier circuit 62. The output of the second multiplier circuit 72 is coupled via a resistor 66 to the horizontal deflection amplifier 68.

Resistors 64 and 66 are connected to the same input terminal of the horizontal deflection amplifier to form a simple adder circuit in a known manner. This adder circuit combines the horizontal and vertical scanning signals to affect image rotation, as described above. The horizontal deflection amplifier 68 drives the horizontal deflection coil 70 to cause the electron beam in an image pickup tube to be scanned in the horizontal direction.

The output of the first multiplier circuit 62 is coupled via a resistor 6 to the inverting input of the driver amplifier 12. The source of vertical scanning signals 10 is coupled via a resistor 6 to the inverting input of the driver amplifier 12. The inverting input of the driver amplifier is therefore a summing point for the vertical and horizontal scanning signals which are combined to affect image rotation as described above. The driver amplifier 12 amplifies and inverts the input signals.

The output of the driver amplifier is coupled via diodes 14 and 16 to common base stages shown generally as 20 and 40, respectively. The cathode of diode 14 and the anode of diode 16 are connected together and connected to the output of the amplifier 12. The anode of diode 14 is coupled via resistor 27 to the emitter of an NPN transistor 25 connected in common base configuration. The emitter of transistor 25 is also coupled via resistor 26 to ground. The base of transistor 25 is coupled via the series connection of diodes 23 and 24, poled as shown in the FIGURE, to ground. A capacitor 22 bypasses the base of transistor 25 to ground and a resistor 21 connects the base to the positive supply 58. The collector of transistor 25 is coupled to the base of PNP transistor 50.

Similarly, the cathode of diode 16 is coupled via a resistor 47 to the emitter of PNP transistor 45 connected in common base configuration. The emitter of transistor 45 is also coupled via resistor 46 to ground. The base of transistor 45 is coupled via the series connection of diodes 43, and 44, poled as shown in the FIGURE, to ground. The base of transistor 45 is bypassed to ground by capacitor 42 and connected via resistor 41 to the negative supply 60. The collector of transistor 45 is connected to the base of NPN transistor 52.

The output terminal 56 is formed by the connection of the collector of transistor 50 to the collector of transistor 52. The emitter of transistor 50 is connected to the positive supply 58 and the emitter of transistor 52 is connected to the negative supply 60. Transistors 50 and 52 thus form a pair of amplifier stages which are connected in push-pull. The particular type of circuit illustrated in the FIGURE is known as a complementary-symmetry circuit.

The output terminal 56 is coupled to the vertical deflection coil 45 which is connected in series with current sampling resistor 18 to ground. The connection of vertical deflection coil 54 and current sampling resistor 18 is coupled to the noninverting input terminal of driver amplifier 12, thus closing the feedack loop.

In operation, the first multiplier circuit is adjusted, by means not shown in the FIGURE, to generate the proper amplitude and polarity of the horizontal sawtooth signal to produce the desired horizontal skew correction for image rotation. The second multiplier is similarly adjusted to generate the proper amplitude and polarity of the vertical scanning signal to produce the desired vertical skew correction for image rotation. The output of the first multiplier circuit is summed via a simple adder circuit comprising and resistors 6 and 8 with the output of the vertical sawtooth generator 10. This summed signal is applied to the inverting input of the driver amplifier 12. The amplified and inverted signal appearing at the output of the amplifier 12 is coupled to the emitters of the common base transistors 25 and 45. The voltage at the emitters of transistors 25 and 45 is converted to a current which flows in the base circuits of transistors 50 and 52, respectively. These base currents will cause transistors 50 and 52 to reproduce the summed signal at the output terminal 56. Direct current feedback from sampling resistor 18 is used to stabilize and linearize the output of the amplifier, in a known manner.

The bases of transistors 25 and 45 are biased at $2V_{be}$ above ground potential by the diodes 23, 24, and 43, 44, respectively. The voltage drop of $1V_{be}$ cross the base-emitter junctions of transistors 25 and 45 will result in a voltage at the emitter of each of these transistors of $1V_{be}$. In the absence of signal at the output driver amplifier 12, there will be insufficient voltage at the emitters of transistors 25 and 45 to forward bias diodes 14 and 16, respectively. Therefore, these diodes will disconnect the common base circuits 20 and 40 from each other, in the absence of signal. The regulated voltage at the emitters of transistors 25 and 45 and the resistors 26 and 46 coupling the emitters to ground establish a constant current flow in the collectors of transistors 25 and 45 in the absence of signal. These collector currents in turn establish the base currents for output transistors 50 and 52. This small base current in the output transistors turns the transistors slightly on, thus operating them in class AB and virtually eliminating crossover distortion. The independent action of common base circuits 20 and 40 allows the current in the output transistors 50 and 52 to be exactly controlled. This control is independent of the current splitting action of the multiple $V_{be}$ drops which are typically inserted between the bases of the output transistors in order to provide the proper bias. This exact control eliminates the need to supply several times the required base current in order to compensate for this current splitting action which may vary with temperature and component characteristics.

It should be noted that the direct current feedback will maintain the voltage at the output terminal 56 at approximately zero volts in the absence of signal. As the parameters of the upper (20, 50), and lower (40, 52) portions of the amplifier probably will not match, a dc offset voltage will be produced by the driver amplifier 12 and coupled via one of the diodes 14, 16 to one of the common base amplifiers 20, 40. This dc voltage will alter the quiescent current through one of the transistors 50, 52 so that it is identical to the current in the other transistor, thus maintaining the output at zero volts, in the absence of signal. This does not, however, destroy the independence of action of the current sources described above.

The use of $V_{be}$ related voltages in the constant current source configuration, rather than zener diodes or other such regulating circuits, makes the constant current source relatively independent of temperature variations. The use of the constant current source configuration allows these circuits to utilize the full range of the supplies 58 and 60, respectively, to maintain the base current in the output transistors which is required to prevent crossover distortion. The use of the constant current source transistors as common base signal drivers for the output transistors enable them to operate as constant current sources with a full supply range without limiting the dynamic range of the signal that they can deliver to the output transistor.

As previously stated, it is desirable to have a relatively wide bandwidth in this amplifier. The common base stages and the collector output from the transistors 50 and 52 provide a high voltage gain in this section of the vertical amplifier. Thus, only a moderate gain is required from the driver amplifier 12, thus allowing its limited gain-bandwidth product to be utilized to provide the necessary bandwidth. This permits the amplifier to have the required dynamic range and bandwidth in the more efficient class B configuration and thereby allow efficient coupling of horizontal rate signals through the vertical deflection amplifier to the vertical deflection coil to permit image rotation.

What is claimed is:

1. A push-pull amplifier comprising:
   a pair of amplifier stages connected in push-pull;
   a source of signals to be amplified;
   a pair of common base amplifiers each having the collector coupled to and each being of a complementary type to the transistor at the input of respective ones of said amplifier stages;
   said source of signals to be amplified being coupled to each of said common base amplifiers for driving said amplifier stages to reproduce said signal;
   said common base amplifiers being biased in the absence of said signals as constant current sources, each independent of the other, for controlling the quiescent current of said amplifier stages.

2. The circuit according to claim 1 wherein said amplifier stages are current mode driven by said common base amplifiers.

3. The circuit according to claims 1 or 2 wherein each of said amplifier stages includes an output transistor and said collector of each of said common base amplifiers is coupled to the base of respective ones of said output transistors.

4. The circuit according to claim 3 wherein the signal path between said source of signals to be amplified and each of said common base amplifiers includes a diode which disconnects said signal path from the common base amplifiers in the absence of said signals.

5. In a television camera system for rotation of the image generated by an image pickup tube said system including a source of vertical scanning signals coupled to horizontal and vertical amplifiers and a source of horizontal scanning signals coupled to said horizontal and vertical amplifiers, a push-pull vertical deflection amplifier comprising:
   a pair of amplifier stages connected in push-pull;
   a pair of common base amplifiers each having the collector coupled to and each being of a complementary type to the transistor at the input of respective ones of said amplifier stages;
   said sources of vertical and horizontal scanning signals being coupled to each of said common base amplifiers for driving said amplifier stages to reproduce said signals;
   said common base amplifiers being biased in the absence of said signals as constant current sources, each independent of the other, for controlling the quiescent current of said amplifier stages.

6. A television camera system for the rotation of the image generated by an image pickup tube comprising:
   a source of horizontal scanning signals;
   a source of vertical scanning signals;
   a horizontal deflection amplifier coupled to a horizontal deflection coil;
   a vertical deflection amplifier coupled to a vertical deflection coil;
   first coupling means coupling said sources of horizontal and vertical scanning signals to said horizontal deflection amplifier;
   second coupling means coupling said sources of horizontal and vertical scanning signals to said vertical deflection amplifier;
   said vertical deflection amplifier being a push-pull amplifier including a pair of amplifier stages connected in push-pull;
   a pair of common base amplifiers each having the collector coupled to and each being of a complementary type to the transistor at the input of respective ones of said amplifier stages;
   said sources of vertical and horizontal scanning signals being coupled by said second coupling means to each of said common base amplifiers for driving said amplifier stages to reproduce said signal;
   said common base amplifiers being biased in the absence of said signals as constant current sources, each independent of the other, for controlling the quiescent current of said amplifier stages.

* * * * *